(12) United States Patent
Chakravarti et al.

(10) Patent No.: US 6,204,112 B1
(45) Date of Patent: Mar. 20, 2001

(54) PROCESS FOR FORMING A HIGH DENSITY SEMICONDUCTOR DEVICE

(75) Inventors: Ashima Bhattacharyya Chakravarti; Satya Narayan Chakravarti, both of Hopewell Junction, NY (US); James G. Ryan, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/236,186

(22) Filed: Jan. 22, 1999

Related U.S. Application Data

(62) Division of application No. 08/897,176, filed on Jul. 18, 1997, now Pat. No. 5,909,044.

(51) Int. Cl.[7] .............................................. H01L 21/8242
(52) U.S. Cl. ........................................................ 438/243
(58) Field of Search ............................ 438/243, 244–256, 438/239

(56) References Cited

U.S. PATENT DOCUMENTS

| | | | |
|---|---|---|---|
| 4,894,696 | 1/1990 | Takeda et al. | 357/23.6 |
| 4,988,637 | 1/1991 | Dhong et al. | 437/52 |
| 5,065,273 | 11/1991 | Rajeevakumar | 361/313 |
| 5,214,603 | 5/1993 | Dhong et al. | 365/207 |
| 5,292,678 | 3/1994 | Dhong et al. | 437/50 |
| 5,336,629 | 8/1994 | Dhong et al. | 437/52 |
| 5,348,905 | 9/1994 | Kenney | 437/52 |
| 5,378,907 | 1/1995 | Melzner | 257/301 |
| 5,384,277 | 1/1995 | Hsu et al. | 437/52 |
| 5,389,559 | 2/1995 | Hsieh et al. | 437/52 |
| 5,395,786 | 3/1995 | Hsu et al. | 437/52 |
| 5,429,978 | 7/1995 | Lu et al. | 437/52 |
| 5,670,805 | 9/1997 | Hammerl et al. | 257/301 |
| 5,753,526 | 5/1998 | Ozaki | 437/52 |

FOREIGN PATENT DOCUMENTS 2-130871   11/1988   (JP) .............................. H01L/27/10

OTHER PUBLICATIONS

Nesbit, L., et al. "A 0.6 micron squared Trench DRAM Cell . . . ", IEDM 1993, pp. 627–630.

Primary Examiner—Charles Bowers
Assistant Examiner—Craig Thompson
(74) Attorney, Agent, or Firm—Jay H. Anderson; Alison D. Mortinger; Graham S. Jones, II

(57) ABSTRACT

A method for forming an integrated circuit device, and the product thereby produced, are disclosed. The disclosed method includes the steps of obtaining a substrate with a patterned gate conductor and cap insulator, forming a dielectric masking layer having at least one opening, and, using the opening in the dielectric masking layer as a mask, forming a trench capacitor which is self-aligned to the cap insulator edge. The method is particularly useful for a producing a DRAM device having a dense array region with self-aligned deep trench storage capacitors connected by buried straps.

17 Claims, 3 Drawing Sheets

PROCESS FOR FORMING A HIGH DENSITY SEMICONDUCTOR DEVICE

This application is a division of U.S. patent application Ser. No. 08/897,176, filed Jul. 18, 1997, now U.S. Pat. No. 5,909,044.

BACKGROUND OF THE INVENTION

1. Field of the Invention

The present invention generally relates to a semiconductor integrated circuit device and a method for the fabrication thereof, and, more particularly, to a memory device having a compact cell design with a deep trench storage capacitor self-aligned to the gate conductor cap insulator of the access transistor and connected by a buried strap.

2. Discussion of the Related Art

Semiconductor memory devices, and particularly Dynamic Random Access Memory (DRAM) devices are well known. An essential feature of a DRAM is a memory cell. A cell comprises a capacitor for storing charge and an access transistor (also referred to as a pass transistor or a pass gate) for transferring charge to and from the capacitor. Trench, or deep trench (DT), capacitors are typical and are well known. A cell also comprises a means (often referred to as a strap) for connecting one transistor source/drain region to the capacitor. At the present state of the art, more than 64 million DRAM cells are present on a memory chip, organized in the form of an array. Thus, because cell size determines chip density, size and cost, reducing cell area is the DRAM designer's primary goal. Cell area may be reduced by shrinking the individual feature size, or by forming structures which make more efficient use of the chip surface area. The latter approach is particularly desirable.

In a typical process for fabricating DRAM devices having trench capacitors, the capacitor structure is completely formed prior to the formation of the transistor gate conductor (GC) structure. Thus, a typical process sequence involves the steps of opening the trench, filling the trench, forming the node conductors, then forming the gate stack structure. It will be understood that a separate lithographic step is required for gate stack definition, which may lead to overlay and other errors. Thus, using known fabrication processes, a larger surface area must be included in the cell structure to provide tolerance for such errors.

It is accepted practice in the DRAM cell art to connect a trench capacitor to a transistor by means of a surface strap. However, low process tolerances for the steps of forming the surface strap may lead to an increased incidence of shorts between a surface strap and an adjacent gate conductor. Therefore, it is often preferred to provide a buried strap for connecting the source/drain region of the transistor to the capacitor. Where the strap is buried, more room is available on the surface of the semiconductor device and higher device densities may be obtained. Moreover, since the buried strap contacts are formed prior to formation of many other structures, potential damage to other surface structures is minimized. Nevertheless, known processes for forming buried straps still provide for forming the gate conductor in a separate lithographic step after trench capacitor formation, and thus are not self-aligned.

The following references are representative of the prior art.

U.S. Pat. No. 5,336,629 to Dhong, et al., describes a folded bitline DRAM cell in which the access transistor is placed vertically over the trench capacitor by growing a silicon epitaxial layer over the trench region. Thereafter an ohmic contact between the source diffusion of the access transistor and the trench capacitor is made laterally via sidewall P+ polysilicon straps stemming from the trench polysilicon electrode.

U.S. Pat. No. 4,988,637 to Dhong, et al., describes a DRAM cell, which includes a trench storage capacitor buried in the substrate juxtaposed to the access transistor, that is formed by an epitaxial silicon growth and a mesa etch process. The contact between the two elements is established via a doped polysilicon strap formed over the buried trench in the mesa region which is butted against the access transistor source situated in the epitaxial silicon region.

U.S. Pat. No. 5,389,559 to Hsieh, et al., describes a DRAM cell process having the conventional structure of an access transistor whose source diffusion is ohmically connected to the trench storage capacitor via a buried strap comprising of an outdiffused doped region from doped polysilicon layer on the trench sidewall.

U.S. Pat. No. 4,894,696 to Takeda, et al., describes a DRAM cell process in which the memory cell capacitor is comprised of a trench which is situated at a position defined by a device isolation region on one side and the access transistor gate on the other side. However, the depth of the trench is limited to 2 microns and subsequently, a P+ guardband (HiC) layer is developed around the trench to decrease the alpha particle induced soft error problem in the cell. The contact from the storage node electrode to the access transistor source diffusion is made through an N+ poly doped polysilicon layer In the trench. The dielectric layers for the capacitance are then deposited consisting of films, e.g. single or multilayer $SiO_2/Si_3N_4/SiO_2$ or $Ta_2O_5$. Thereafter, the plate of the capacitor consisting of a P+ or N+ polysilicon layer is defined consisting of polysilicon deposition and lithography steps. The trench process requires a number of high temperature process steps which are deleterious to previously formed implant regions and may cause outdiffusion of implanted species.

U.S. Pat. No. 5,429,978 to Lu, et al., is similar to U.S. Pat. No. 4,894,696 to Takeda, et al., in that the storage trench capacitance of the DRAM cell is self-aligned to the device isolation region on one side and the access transistor gate on the other side. The trench capacitor is made of a pillar type trench structure for increased capacity. The contact to the access transistor source node is made through a wraparound N+ layer formed by outdiffusion of a doped PSG layer deposited in the trench.

Even in view of the known art, there still exists a continuing demand for semiconductor memory device designs and processes which utilize fewer processing sequences, while at the same time facilitating greater storage capacity and allowing more densely packed memory arrays. There further exists a need for a trench capacitor structure which is self-aligned to the gate conductor and is connected by means of a buried strap. Thus, it would be desirable to provide a method for satisfying such demand and solving the aforesaid and other deficiencies and disadvantages.

SUMMARY OF THE INVENTION

An object of the present invention is to overcome the problems in the art discussed above.

Another object of the present invention is to provide a semiconductor device and method for the manufacture thereof having increased chip density.

Another object of the present invention is to provide a semiconductor memory cell structure and method for the manufacture thereof having decreased cell size.

Another object of the present invention is to provide a semiconductor memory cell structure and method for the manufacture thereof having a buried strap rather than a surface strap.

Another object of the present invention is to provide a semiconductor memory cell structure and method for the manufacture thereof having a deep trench capacitor placed adjacent to the gate by a self-aligned process.

Still, yet another object of the present invention is to provide a semiconductor memory cell structure and method for the manufacture thereof having a trench storage node capacitor which is fabricated subsequent to the formation of the gate stack.

Thus, according to the present invention, the method for forming a semiconductor device comprises the steps of:

a) obtaining a semiconductor device substrate having at least one patterned gate conductor and at least one patterned cap insulator thereon;

b) forming a dielectric masking layer over the at least one cap insulator;

c) forming at least one opening in the dielectric masking layer;

d) using the at least one opening in the dielectric masking layer as a mask, forming at least one opening in the substrate for a capacitor.

The method may optionally comprise the additional steps of:

e) forming a layer lining the at least one opening in the substrate wherein the layer comprises a material having a high dielectric constant; and f) substantially filling at least the lower region of the at least one opening in the substrate with doped polysilicon.

Additionally, or in the alternative, the method may optionally comprise the additional step of:

g) forming a buried strap conductor.

In addition, according to the present invention, a semiconductor device is disclosed which is produced by the aforementioned steps. In the alternative, the semiconductor device comprises:

a) a substrate having at least two patterned gate conductors thereon, each gate conductor overlaying a gate insulator;

b) at least one insulating region formed over and on the sides of each of the at least two patterned gate conductors;

c) at least one trench capacitor formed in the substrate, such that each sidewall of the trench capacitor is aligned with an edge of an insulating region on the side of a gate conductor;

d) a doped conductive region extending under the gate insulator and electrically contacting an electrode of the trench capacitor.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENT

Figure 1:
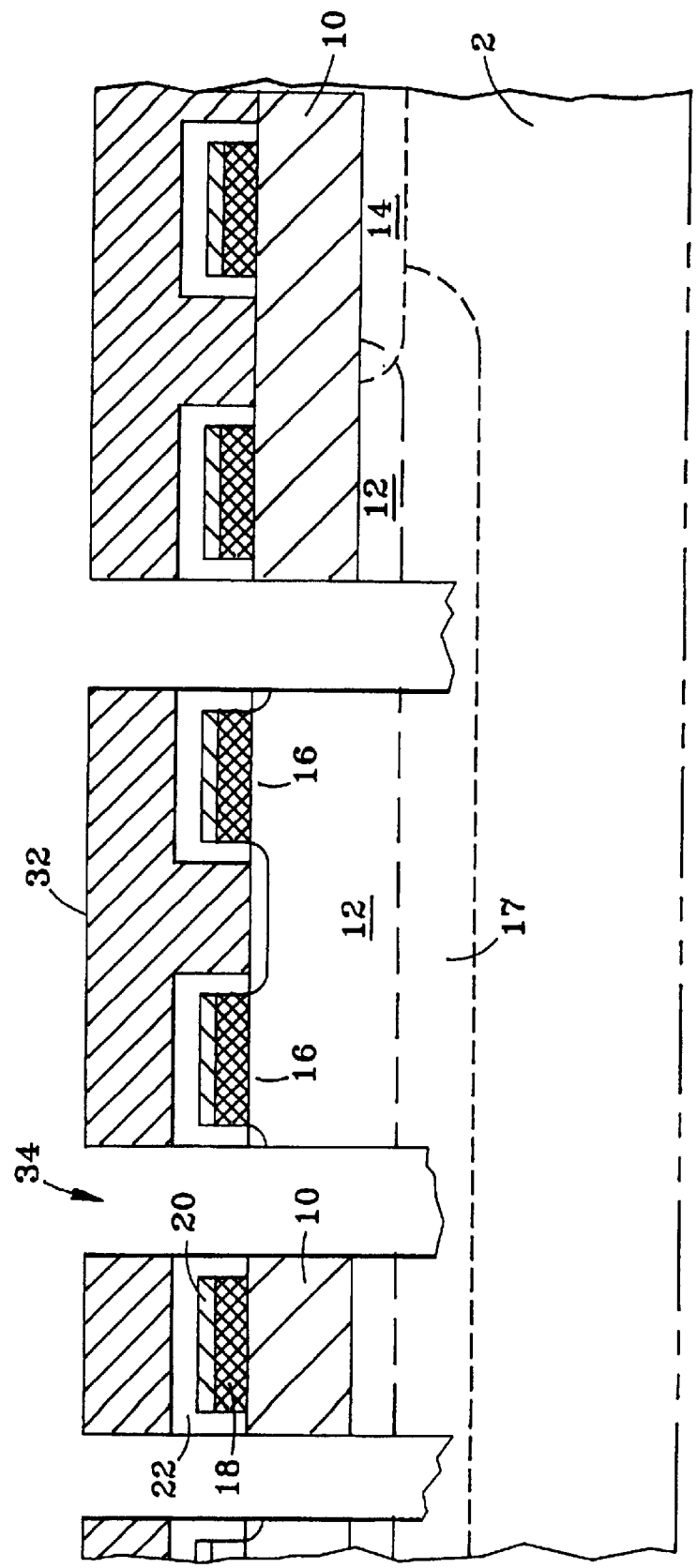
FIG. 1 shows a partial cross sectional view of a partially completed memory cell according to the present invention.

With reference to FIG. 1, in order to make one embodiment of the device of the present invention, a P– (1–2 ohm-cm) substrate (2) is obtained having a shallow trench isolation (STI) structure (10), P-type wells (12), N-type wells (14), and Vt adjust implanted regions (16) as is conventional in twin well CMOS technology. Since a negative bias is normally applied to the array P-well, a high energy phosphorus implant is performed to form an N+ layer junction approximately 1.5 micrometer below the silicon surface in the array in order to provide an isolation band (IB) (17) between P-well and P-type substrate (2). Thereafter, a gate stack structure is formed for the array and support FETs which consists of a thermal gate oxide film (not shown) approximately 8 nm thick, a phosphorus doped polysilicon layer (18) deposite approximately 100 nm thick, a sputtered $WSi_x$ layer (20) approximately 75 nm thick (20), and a gate cap LPCVD nitride layer (22) deposition approximately 300 nm thick as deposited. The gate structure is then patterned by photolithography and etching of nitride, $WSi_x$, polysilicon (18120122), and remaining thermal oxide films to form a gate electrode and a word line of a DRAM. Finally, a gate sidewall oxidation process is performed which includes a $WSi_x$ anneal at around 800 deg C. followed by a rapid thermal oxidation (RTO) of the stack at about 1050 deg C. to grow approximately 10 nm oxide on the gate sidewall. A backside etch of the wafer is also performed to remove deposited films prior to gate sidewall oxidation to insure a consistent wafer to wafer temperature during oxidation.

Still with reference to FIG. 1, a shallow phosphorus implant is done next to form source/drain regions junctions of an array device as well as the LDD (lightly doped drain) junctions of an NFET support device. An LPCVD nitride gate spacer layer (30) 50 nm thick or greater is deposited followed by the deposition of an LPCVD TEOS or equivalent layer (32) approximately 700 nm thick. The TEOS or equivalent layer (32) is used as a mask layer for etching a trench 34 in substrate 2. which forms the storage capacitance for a memory cell device. The trench process involves a deep trench (DT) mask expose step using a multilayer DUV resist followed by a mask open RIE process to remove dielectric layers e.g. TEOS or equivalent, nitride, oxide, etc., anisotropically and to stop on the silicon surface. The RIE process must ensure that an adequate thickness of gate sidewall insulating film (30) remains after the mask etch which is needed to protect the gate stack during etching of the silicon trench (34).

Following the mask open etch, resist is stripped and a trench 34 in the silicon substrate 2 is etched in a self-aligned manner using insulating layer 30 and later 32 formed on the upper and side surfaces of the gate electrode or wordline and STI as masks. Although the trench RIE process is anisotropic and uses an HBr/NF3/02 chemistry, good control of the trench sidewall slope is necessary in order to avoid reentrant profile and achieve a trench depth of 4–5 micrometers. Following the trench etching, the remaining TEOS or equivalent layer (32) is removed via wet etching. Attention should be paid to see if a nitride overhang exists over the opening of the trench (34) and should be removed which can otherwise lead to voids in polysilicon filling of the trench (34). Thereafter, a sacrificial oxide layer (not shown) is grown in the trench at a temperature of 800 deg C. to passivate any silicon damage caused by trench etching and is subsequently stripped.

Figure 2:
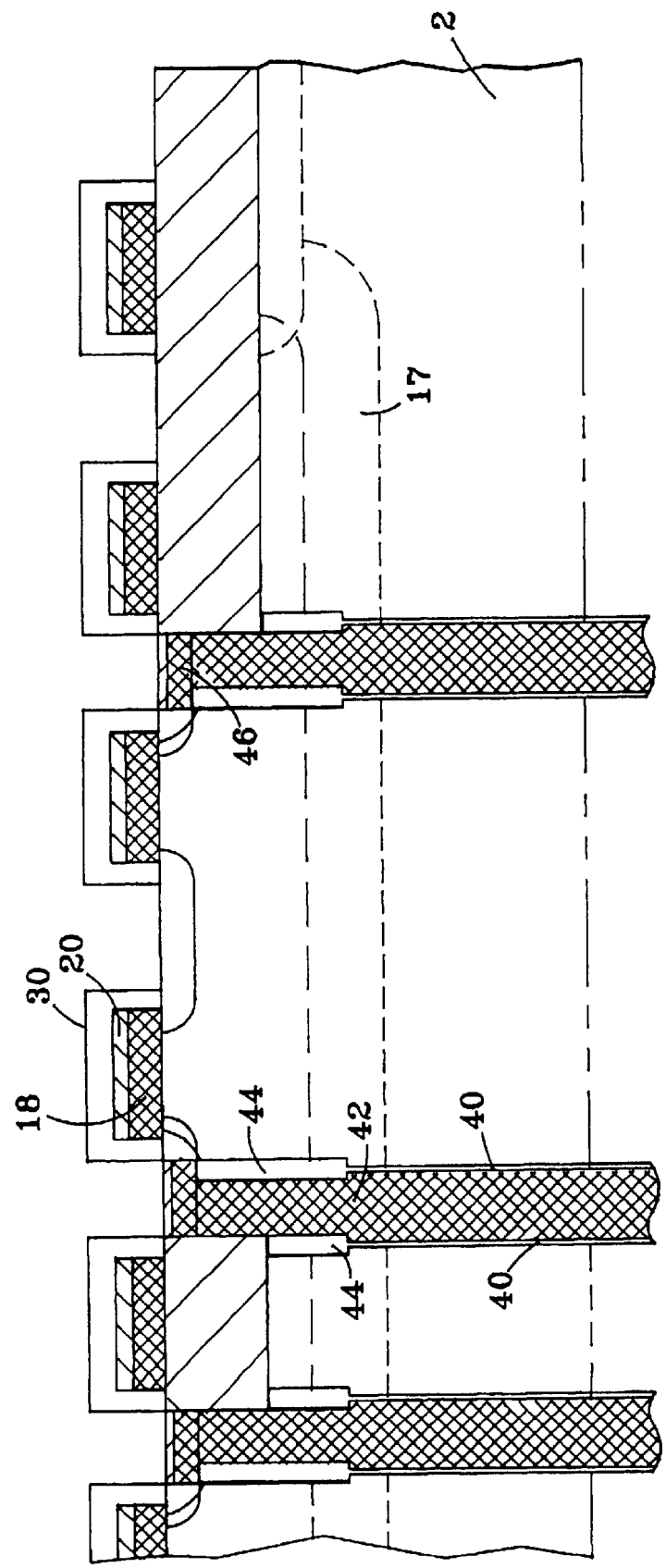
FIG. 2 shows a partial cross sectional view of a partially completed memory cell according to the present invention.

With reference to FIG. 2, to form the node dielectric layer, a thin nitride layer (40) is formed in-situ by a fast thermal process (FTP) followed by a reoxidation of the nitride layer (40) at a temperature of 900° C. or below. The equivalent oxide thickness of the node dielectrics is approximately 4 nm. Next the trench (34) is filled by depositing heavily doped (N+) amorphous polysilicon (42), the excess of which is polished back to the gate space nitride layer (30) on the wafer front and backsides by a chem-mech polish (CMP) method. Next the polysilicon film (42) is recessed to a depth of about 1.3 micrometers to allow a collar (sidewall) (44), formed of oxide to be formed in order to provide vertical isolation of the memory cell. Thereafter, the node dielectric regions are partially removed by wet chemical etching and a collar sidewall oxide (44) is grown thermally approximately 8 nm thick at a temperature of 900° C. or less. Following the thermal oxidation, an ozone TEOS oxide layer is deposited and annealed for TEOS densification to achieve a total collar oxide thickness of approximately 30 nm on the trench sidewall for a typical trench mask dimensions of 200 nm×400 nm. Next the TEOS collar (44), formed of oxide is etched down to the gate stack nitride level by a RIE process and special attention must be given to ensure that no residual oxide remains on the first polysilicon layer (42) of the trench. If the residual oxide of collar (44) is not removed properly, it can leave an interface film on the first polysilicon layer (42) and thus lead to poor contact with the next polysilicon layer (46).

Next a heavily arsenic doped (N+) Yamorphous second polysilicon layer is deposited and CMP planarized to fill the trench (34) using a method similar to the first polysilicon layer (42). Then the second polysilicon layer (46) is recessed approximately 150 nm below the surface of silicon substrate (2) by using a RIE process to form region (46). Afterwards, the deep trench (DT0 collar (44) (formed of oxide) exposed on the upper part of the trench (34) by the recess RIE of the second polysilicon layer (46) is removed by a wet chemical etching.

The next process steps describe the buried strap formation which is meant to provide ohmic connection between the trench storage node capacitance and the pass transistor. A buried strap intrinsic polysilicon layer is deposited to fill the trench recess of the second polysilicon film and subsequently CMP planarized down to the gate nitride level. At the same time any polysilicon on the backside of the wafer may be removed by CMP. The intrinsic polysilicon layer is doped by outdiffusion of arsenic dopant from the heavily (N+) doped polysilicon layers during subsequent thermal processing and into the P-well region through a small opening at the trench top from which the collar oxide was removed. Thus a buried N+ arsenic strap contact can be made to the phosphorus junction of an array transistor next to the trench. The buried strap polysilicon is recessed approximately to a depth of 50 nm below the silicon surface by a RIE process selective to the gate nitride layer and finally an LPCVD TEOS oxide film is deposited on the trench top and planarized by CMP using gate nitride as a stop layer to complete the trench process. The device is then completed using conventional processes.

In another embodiment of the trench process, a wrap around n-band trench structure can be developed which ohmically connects to the N+ IB junction mentioned earlier. In this case, it forms the bottom electrode of a trench capacitor which can be biased at a desired potential by biasing the IB N+ band. Such a scheme can be used to reduce the electric field across the trench node dielectric and improve reliability. To achieve this structure, following the trench etching, an arsenic doped glass (ASG) layer is deposited in the trench which is then removed from the top part of the trench (approximate depth: 1.5 micrometer) by a DUV resist expose process. A cap TEOS oxide layer is then deposited and ASG is annealed at a temperature around 1000 deg C. to form a continuous N+ region around the bottom part of the trench which also links up with the N+ IB band (11). The purpose of the cap TEOS oxide layer is to prevent arsenic autodoping of the exposed upper part of the trench sidewall during the ASG anneal. The next process step is ASG strip and clean followed by sacrificial oxide growth and node dielectric formation as described above.

As the feature size continues to shrink and the trench lateral dimensions become increasingly smaller, etching a deep trench for attaining increased storage node capacitance would pose a significant challenge. It is therefore necessary to consider a shallow trench structure using high dielectric constant materials to achieve the required cell capacitance. An embodiment of a trench capacitor having a shallower depth than mentioned above is discussed which is formed by using a high dielectric constant material such as $Ba_xSr_{(1-x)}TiO_3$ (BSTO).

Starting with the same process as before up to the step of silicon trench etching all process steps remain the same except the trench depth is shallower typically 2 micrometers. After a sacrificial oxide layer growth in the trench and removal of the film, a thin thermal oxide is grown followed by a deposition of an ozone TEOS layer similar to the collar oxidation process as described above. The oxide layer is then recessed to a depth of about 100 nm below the silicon surface using a RIE process selective to gate nitride similar to above. Next a heavily arsenic doped (N+) amorphous Polysilicon layer is deposited and CMP planarized to the nitride level (frontside and backside) and afterwards recessed about 50 nm below the trench silicon surface level by using a RIE process selective to gate nitride as described before. This doped polysilicon layer forms the buried strap contact to the array transistor junction by outdiffusion of N+ dopants via the trench sidewall where the collar oxide was removed. It also forms the bottom electrode of the trench capacitor. Next a thin barrier layer (TaxSiyN) is deposited followed by deposition of a platinum layer. The platinum stack can be etched following the deposition of a hard mask e.g. TiN which can be patterned by lithography. A $Ba_xSr_{(1-x)}TiO_3$ (BSTO) film is then deposited on the platinum electrode by using a two step MOCVD method and a temperature around 400 deg C. This is followed by deposition a second platinum layer and the stack is patterned by using a similar process as before. BSTO can be removed by wet chemical etching and annealed by a rapid thermal process. An N+ polysilicon film which forms the upper electrode of the trench capacitance is deposited and planarized to the silicon level by CMP and RIE processes. Finally, a BPSG type oxide layer is deposited over the entire topography and planarized by CMP. A contact to the trench capacitor polysilicon upper electrode can be provided at the same mask level when contacts are made to array bit line diffusions. After the completion of the trench structure, an N+ source/drain implant for the support NFET device and a P+ source drain implant are performed using appropriate mask levels.

One embodiment of a process to form the present device may be even more clearly understood from the following process steps. After definition of the active area and formation of the P-well and N-well regions and stripping of the gate sacrificial oxide, the following steps are performed.

Figure 3:
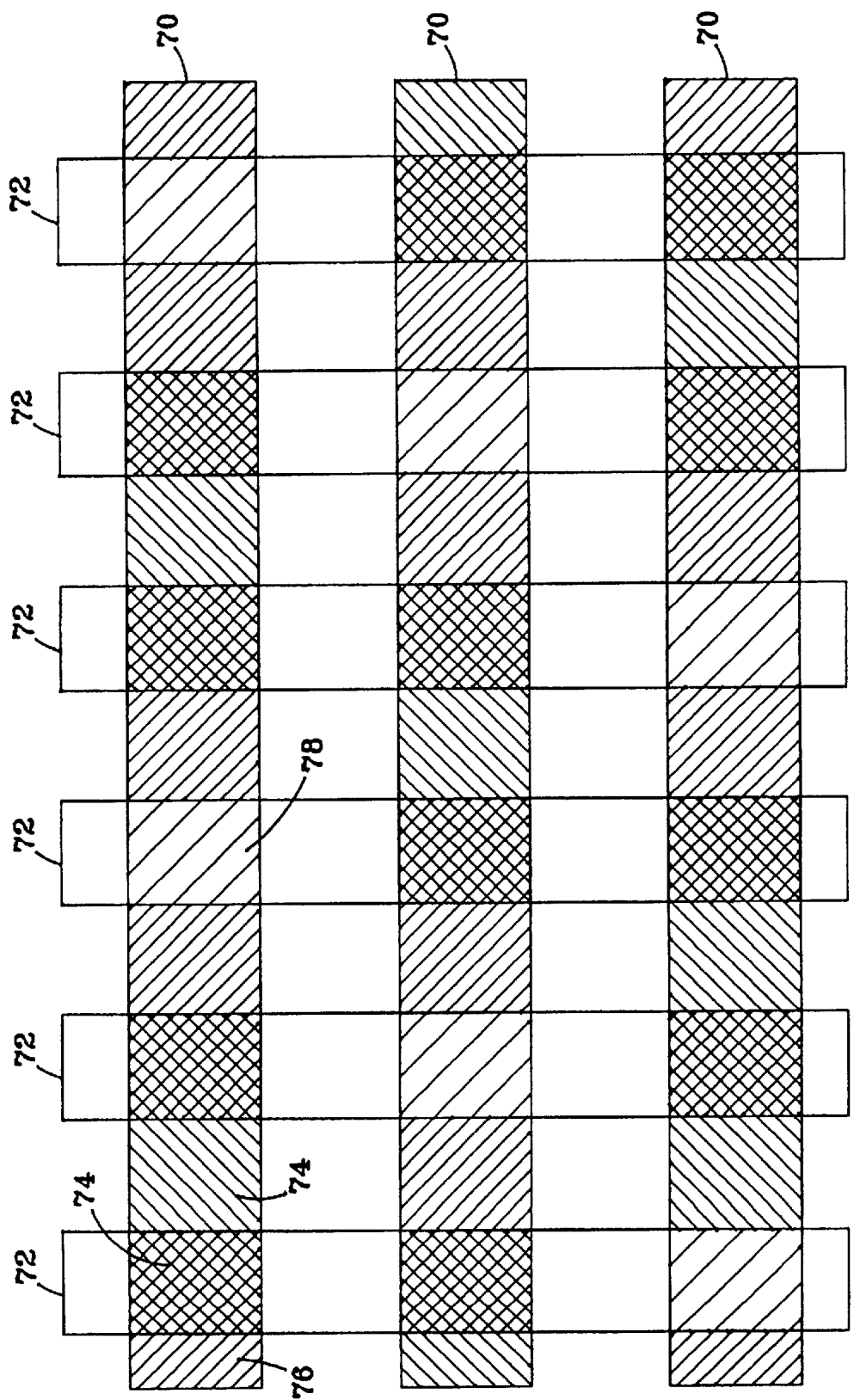
FIG. 3 shows a schematic top view of a plurality of memory cells.

1. Gate Conductor(GC) stack Thermal gate Oxidation In-situ doped (N+) polysilicon deposition W-Six sputter deposition Cap nitride deposition 2. GC mask Expose/develop Arc/nitride etch/resist strip W-Si/polysilicon etch Backside RIE nitride/polysilicon/clean Gate sidewall oxidation(RTO)
3. Array source/drain mask Expose/develop Angled implant phosphorus Implant/Phosphorus array NFET source/drain junctions Resist strip/clean
4. NFET NLDD mask Expose/develop Implant Phosphorus NLDD support NFET Resist strip/clean
5. DT Etch Dielectric Deposition(low temperature process around 700 deg C. needed) LPCVD nitride deposition LPCVD TEOS or equivalent deposition and densification
6. DT mask Expose/develop Dielectric etch TEOS or equivalent/nitride/oxide Resist strip/clean
7. DT Etch Deep trench etch into silicon (TEOS or equivalent mask) Clean Node Sacox growth(=<800 deg C.) and strip
8. Node Dielectric Deposition RTN/oxidation(=<900 deg C.)
9. DT N+ polysilicon fill#1 Deposition of amorphous polysilicon#1 N+(arsenic) doped DT poly#1 CMP( backside polish to nitride and frontside polish to TEOS) Brush clean DT mask TEOS strip Clean DT polysilicon#1 recess RIE(depth approximately same as IB-band/P-well junction in array from silicon surface)
10. Trench Dielectric Etch/Collar Oxidation Node oxide/nitride etch around trench collar (up to recessed polysilicon #1) Clean Collar sidewall Oxidation( Furnace 900C deg C.) Collar TEOS(LPCVD) deposition and densification Collar etch down to recessed polysilicon#1 level
11. DT N+ Polysilicon fill #2 Preclean Deposition of amorphous polysilcon #2 (N+) arsenic doped DT Poly#2 CMP(polished down to nitride) Brush/megasonic clean DT polysilicon recess RIE#2( etch depth about 100 nm below silicon surface)
12. Buried Strap Formation Wet etch collar oxide around trench exposed by Polysilicon (intrinsic) deposition CMP polysilicon to nitride Brush clean/megasonic clean RIE recess etch buried strap poly (about 50 nm below silicon surface) Clean
13. Trench Top Oxidation Preclean LPCVD TEOS fill trench top RIE etch back to nitride The cell layout of an embodiment of the present device may be even more clearly understood with reference to FIG. 3, in which are shown word lines, or gate conductors (70), bit lines (72), a top view of the access transistor (74), a top view of the capacitor (76), and a top view of the STI region (78).

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method of forming a semiconductor device comprising the steps of:
   a) obtaining a semiconductor device substrate having at least one patterned gate conductor and at least one patterned cap insulator thereon;
   b) forming a dielectric masking layer over said at least one cap insulator;
   c) forming at least one opening in said dielectric masking layer;
   d) using said at least one opening in said dielectric masking layer as a mask, forming at least one opening in said substrate for a capacitor.

2. The method of claim 1 wherein said patterned cap insulator comprises silicon nitride.

3. The method of claim 1 wherein said patterned gate conductor further comprises a sidewall insulator.

4. The method of claim 1 wherein said dielectric masking layer comprises a layer of material selected from the group consisting of silicon nitride and TEOS.

5. The method of claim 1 further comprising, after step (d), the steps of:
   e) forming a layer lining said at least one opening in said substrate wherein said layer comprises a material having a dielectric constant sufficient to form a storage device; and
   f) substantially filling at least said lower region of said at least one opening in said substrate with doped polysilicon.

6. The method of claim 1 wherein said at least one opening in said substrate for a capacitor is self-aligned to said at least one patterned gate conductor.

7. The method of claim 1 further comprising, after step (d), the steps of:
   e) forming a layer lining said at least one opening in said substrate wherein said layer comprises a material having a high dielectric constant; and
   f) substantially filling at least said lower region of said at least one opening in said substrate with doped polyslicon.

8. The method of claim 7 wherein said material having a high dielectric constant is selected from the group consisting of silicon nitride, silicon oxide, $Ta_2O_5$, and $Ba_xSr_{(1-x)}TiO_3$ (BSTO).

9. The method of claim 7 further comprising, after step (f), the step of:
   g) forming a buried strap conductor.

10. A method of forming a semiconductor device comprising the steps of:
    a) forming a semiconductor substrate having at least one patterned gate conductor and at least one patterned cap insulator formed on said gate conductor having edges thereon;
    b) forming a dielectric masking layer over said at least one cap insulator;
    c) forming at least one opening in said dielectric masking layer, said at least one opening in said dielectric masking layer comprising a mask, aligned with at least one opening in said substrate for a capacitor; and
    (d) forming a trench in said substrate self-aligned with one of said edges.

11. The method of claim 10 wherein:
    said patterned cap insulator comprises silicon nitride.

12. The method of claim 10 wherein:
    said patterned gate conductor has a sidewall insulator.

13. The method of claim 10 wherein:
    said dielectric masking layer comprises a layer of material selected from the group consisting of silicon nitride and TEOS.

14. A method of forming a semiconductor device comprising the steps of:
- a) forming a substrate having at least two patterned gate conductors thereon, each gate conductor overlying a gate insulator;
- b) forming at least one insulating region over and on said sides of each of said at least two patterned gate conductors;
- c) forming at least one trench capacitor in said substrate, such that a sidewall of said trench capacitor is self-aligned with an edge of an insulating region on said side of a said gate conductor;
- d) forming a doped conductive region extending under said gate insulator and electrically contacting a buried strap electrode on the surface of said trench capacitor, and
- e) forming said trench capacitor with a central electrode and a dielectric collar below said buried strap electrode, said collar surrounding the upper end of said central electrode of said capacitor.

15. The method of claim 14 wherein:

said capacitor comprises a thin nitride layer formed on said sidewalls of said trench, and said trench being filled with a first, heavily doped amorphous, polysilicon layer within said thin nitride layer, said first, heavily doped, amorphous, polysilicon layer being deeply recessed below said top of said trench, said collar formed on said sidewalls of said trench above said deeply recessed first, heavily doped, amorphous, polysilicon layer being formed of a dielectric oxide, a second, heavily doped, amorphous polysilicon layer, said second, heavily doped, amorphous, polysilicon layer being shallowly recessed below said top of said trench, leaving a shallow recess above said second, heavily doped polysilicon layer, and said buried strap electrode being composed of doped, intrinsic polysilicon filling said shallow recess in contact with a junction of an array transistor next to said trench.

16. A method of forming a semiconductor device comprising:

forming a semiconductor device substrate having at least one patterned gate conductor thereon with source/drain regions with an insulating region formed over and on sides of said gate conductor, said insulating region having sides with edges;

forming a deep trench in said substrate for a storage capacitance for a memory cell self-aligned with one of said edges of said insulating region, forming a dielectric lining layer (40) on the walls of said trench and a dielectric collar (44) at the top of said trench to provide vertical isolation of said memory cell, said collar and said lining layer being recessed below the top of said trench, leaving a portion of a recess space on the top of said trench, forming a doped polysilicon capacitor plate filling the space inside of said collar and said dielectric lining layer, and recessed below the top of said trench leaving the balance of said recess space on the top of said trench, and forming a strap conductor in said trench on the surface of said collar, said lining layer and said doped polysilicon capacitor plate.

17. A method of forming a semiconductor device comprising:

forming a substrate with at least two patterned gate conductors thereon, said gate conductors having sides, each gate conductor overlying a gate insulator;

forming at least one insulating region over and on said sides of each of said at least two patterned gate conductors;

forming at least one trench capacitor in a lined trench having a depth of from about 4 micrometers to about 5 micrometers in said substrate, such that each sidewall of said trench capacitor is self-aligned with an edge of an insulating region on one of said sides of a said gate conductor;

forming a doped conductive region extending under said gate insulator and electrically contacting an electrode of said trench capacitor, said capacitor comprising a thin reoxidized, nitride layer formed lining said lined trench, with said lined trench being filled with a first, heavily doped, amorphous, polysilicon layer, said first, heavily doped, amorphous, polysilicon layer being deeply recessed to about 1.3 micrometers below said top of said lined trench, forming an oxide collar on said sidewalls of said trench above said deeply recessed first, heavily doped, amorphous, polysilicon layer about 30 nm thick, forming a second, heavily doped, amorphous, polysilicon layer, said second, heavily doped, amorphous, polysilicon layer being shallowly recessed to about 150 nm below said top of said trench, leaving a shallow recess above said second, heavily doped silicon layer, forming a buried strap of doped, intrinsic polysilicon filling said shallow recess in contact with said junction of an array transistor next to said trench, and said buried strap being recessed to about 50 nm below said top of said trench, and forming a TEOS oxide film over said trench, and planarizing said TEOS film.

* * * * *